United States Patent
Griffin et al.

(10) Patent No.: US 11,396,703 B2
(45) Date of Patent: Jul. 26, 2022

(54) APPARATUS AND METHODS FOR IMPROVING CHEMICAL UTILIZATION RATE IN DEPOSITION PROCESS

(71) Applicant: Applied Materials, Inc., Santa Clara, CA (US)

(72) Inventors: Kevin Griffin, Livermore, CA (US); Sanjeev Baluja, Campbell, CA (US); Joseph AuBuchon, San Jose, CA (US); Mario D. Silvetti, Morgan Hill, CA (US); Hari Ponnekanti, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/129,660

(22) Filed: Dec. 21, 2020

(65) Prior Publication Data
US 2022/0195600 A1    Jun. 23, 2022

(51) Int. Cl.
| C23C 16/40 | (2006.01) |
| C23C 16/455 | (2006.01) |
| C23C 16/458 | (2006.01) |
| C23C 16/52 | (2006.01) |
| H01J 37/32 | (2006.01) |

(52) U.S. Cl.
CPC ...... C23C 16/45565 (2013.01); C23C 16/458 (2013.01); C23C 16/45544 (2013.01); C23C 16/45589 (2013.01); C23C 16/52 (2013.01); H01J 37/3244 (2013.01); H01J 37/32431 (2013.01); H01J 37/32449 (2013.01)

(58) Field of Classification Search
CPC ........ C23C 16/45565; C23C 16/45544; C23C 16/45589; C23C 16/458; C23C 16/52; H01J 37/32431; H01J 37/3244; H01J 37/32449
USPC .............. 118/715, 728; 156/345.33, 345.34, 156/345.51, 345.54, 345.55
See application file for complete search history.

(56) References Cited

U.S. PATENT DOCUMENTS

| 2010/0043888 | A1 | 2/2010 | Sneh | |
| 2012/0000490 | A1* | 1/2012 | Chung | ................ C23C 16/4405 134/22.12 |
| 2013/0025539 | A1* | 1/2013 | Piechulla | ................ C30B 31/10 118/724 |

OTHER PUBLICATIONS

L.D. Landau and E.M. Lifshitz, Fluid Mechanics, Copyright © 1959 Elsevier Ltd. All rights reserved, vol. 6, 1959, pp. 102-182.*

* cited by examiner

*Primary Examiner* — Rudy Zervigon
(74) *Attorney, Agent, or Firm* — Servilla Whitney LLC

(57) ABSTRACT

Processing chambers and methods to disrupt the boundary layer are described. The processing chamber includes a showerhead and a substrate support therein. The showerhead and the substrate support are spaced to have a process gap between them. In use, a boundary layer is formed adjacent to the substrate support or wafer surface. As the reaction occurs at the wafer surface, reaction products and byproduct are produced, resulting in reduced chemical utilization rate. The processing chamber and methods described disrupt the boundary layer by changing one or more process parameters (e.g., pressure, flow rate, time, process gap or temperature of fluid passing through the showerhead).

20 Claims, 3 Drawing Sheets

APPARATUS AND METHODS FOR IMPROVING CHEMICAL UTILIZATION RATE IN DEPOSITION PROCESS

TECHNICAL FIELD

Embodiments of the disclosure generally relate to semiconductor manufacturing apparatus and processes. In particular, embodiments of the disclosure are directed to apparatus and methods to improve precursor usage.

BACKGROUND

In conventional deposition processes, a fluid comprising a reactive chemical is flowed across a substrate surface from a showerhead or gas distribution plate. The fluid from the showerhead flows across the substrate surface due to, in part, the pressure of flow rate of the fluid and the driving force resulting from system vacuum. The developed flow across the substrate surface creates a boundary layer adjacent the substrate surface where the surface reactions occur. The boundary layer is a region of space adjacent the substrate surface in which the movement of reactive species is diffusion limited rather than based on the developed flow rate.

Molecules within the boundary layer are available to the substrate surface for reactions or are the reaction products or by-products. A higher amount of products or by-products present in the boundary layer means that there is less space for reactive species hindering access to the substrate surface. As the time progresses, more and more reaction products and byproduct are produced. As a result, the chemical utilization rate is also reduced because it takes a longer time for the reactive species to diffuse to the substrate surface.

Accordingly, there is a need for improved apparatus and methods for vapor deposition processes that may one or more of disrupt the boundary layer and improve the rate of removal of the reaction products and byproducts as well as rate of chemical utilization efficiency.

SUMMARY

One or more embodiments of the disclosure are directed to processing chambers comprising: a showerhead within the processing chamber, the showerhead having a front surface and a back surface that define a thickness of the showerhead, the showerhead having a plurality of apertures to allow a fluid to flow through the showerhead, the plurality of apertures extending through the thickness of the showerhead; a substrate support having a support surface configured to support a wafer during processing, the support surface spaced a process gap from the front surface of the showerhead so that a flow of fluid from the showerhead forms a boundary layer adjacent the support surface, wherein the processing chamber is configured to disrupt the boundary layer while a fluid is flowing through the showerhead.

Additional embodiments of the disclosure are directed to showerheads within a processing chamber, wherein the showerhead comprises a front surface and a back surface that define a thickness of the showerhead, the showerhead having a plurality of apertures to allow a fluid to flow through the showerhead from an inlet connected to the back surface of the showerhead, the inlet has an opening in the back surface of the showerhead, the plurality of apertures extending through the thickness of the showerhead, each of the apertures having a back opening in the back surface and a front opening in the front surface, wherein the inlet is configured to disrupt the boundary layer by changing one or more of the pressure, flow rate, time and temperature of the fluid when the fluid enters in the showerhead.

Further embodiments of the disclosure are directed to substrate supports within a processing chamber, wherein the substrate support comprises a support surface configured to support a substrate during processing, the support surface spaced a process gap from a showerhead so that a flow of fluid from the showerhead forms a boundary layer adjacent the support surface, wherein the substrate support is configured to disrupt the boundary layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
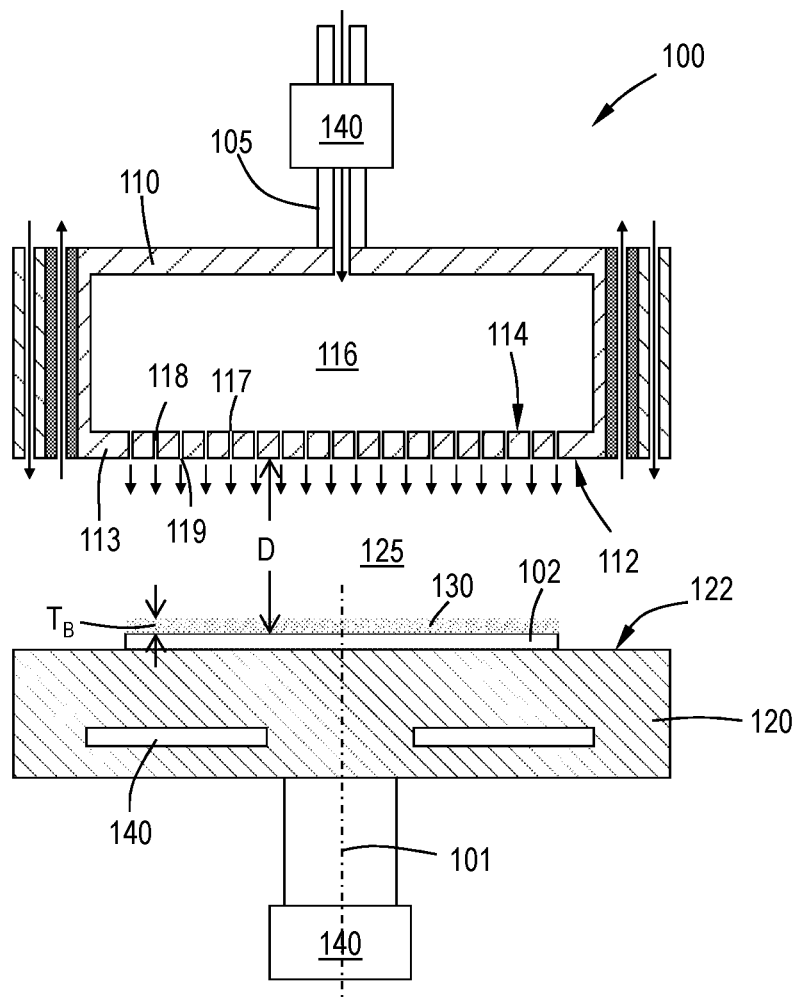
FIG. 1 shows a cross-sectional schematic view of a processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers.

Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "fluid", "precursor", "reactant", "reactive gas" and the like are used interchangeably to refer to any gaseous species that can react with the substrate surface, or with a film formed on the substrate surface.

One or more embodiments of the disclosure improve the rate of chemical utilization efficiency, byproduct removal and purging. As used herein, the term "byproduct" includes reaction products, byproducts and unreacted species. During the start of each ALD cycle, the inert gas flow is replaced with or supplemented with a dose of chemical A. After the dose, chemical A is purged using the inert gas. The next chemical B is injected and the cycle continues. During each half-reaction, byproducts must be removed fast enough to not inhibit the adsorption of new chemicals. After the reaction, the chemical must be removed before the next cycle proceeds.

Accordingly, one or more embodiments of the disclosure provide methods for disrupting the steady state conditions at the wafer surface which can inhibit or slow down reactions. Some embodiments of the disclosure use mechanical pulsing and/or agitation to disrupt the boundary layer. Some embodiments advantageously improve the removal rate of dose chemicals between ALD cycles. Some embodiments advantageously increase the rate of byproduct removal during dosing by chopping dose and pulsing. Some embodiments increase diffusion rate to and from the bulk flow to the wafer surface by boundary layer disruption.

One or more embodiments of the disclosure use mechanical actuators to disrupt pressure, flow and/or concentration at the wafer interface. In some embodiments, the actuators include one or more of pulsing flow control valves, pressure control valves, vertical wafer motion controllers and/or rotational wafer motion controllers.

In some embodiments, rapid movement of the gas at the wafer interface (boundary layer) is increased to one or more of: more efficiently adsorb chemical on the wafer, purge residual chemical in the process region; and/or more efficiently remove reaction products and byproducts during dose.

In some embodiments, the chemical ALD valves are rapidly pulsed during chemical dosing, chopping the total dose time into smaller pulse segments. In some embodiments, rapidly pulsing the flows causes periodic pressure oscillation, improves precursor adsorption and allows time for reaction byproduct removal.

In some embodiments, rapid pulsing of the purge gas (e.g., a nitrogen purge gas) during or after chemical dosing has stopped causes periodic pressure oscillations and improves residual chemical and reaction byproduct removal.

In some embodiments, rapid pulsing of the station purge ALD valve chops or segments the steady state inert purge gas into smaller pulse segments. In some embodiments, rapid pulsing of the station purge causes periodic pressure oscillation and periodic concentration change.

In some embodiments, one or more of the gas valves are pulsed, kept open or kept closed to enhance concentration change during dosing or purge. The various valves include, but are not limited to, precursor gas valves, reactant gas valves, carrier gas valve, purge gas valves and/or station purge gas valves.

In some embodiments, rapid change in the station pressure control valve (throttle valve) position is used to cause periodic oscillation in the wafer region (e.g., the boundary layer).

In some embodiments, the boundary layer is disrupted by rapidly changing the volume in the showerhead. For example, in some embodiments, the pulse diaphragm valve causes push/pull pressure waves.

In some embodiments, the boundary layer is disrupted by rapidly changing the gap between the wafer and gas distribution plate (showerhead). For example, moving or vibrating the wafer pedestal assembly closer to and further from the showerhead during processing.

In some embodiments, the boundary layer is disrupted by rapidly oscillation the rotation motor assembly back and forth parallel to the showerhead surface. This is also referred to as "jittering" the substrate between some angle before ($-\theta$) and some angle after ($+\theta$) the zero position of the process station. The zero position of the process station is the position in which the substrate is centered beneath the gas distribution plate.

FIG. 1 illustrates a schematic view of a processing chamber 100 according to one or more embodiment of the disclosure. The relative sizes and dimensions are exaggerated and altered for illustrative and descriptive purposes and should not be taken as limiting the scope of the disclosure. The processing chamber includes a showerhead 110 and a substrate support 120. The showerhead 110 has a front surface 112 and a back surface 114 that define an overall thickness of the showerhead 110. The showerhead 110 of some embodiments includes a plenum 116 in fluid communication with an inlet 105. The showerhead 110 includes a plurality of apertures 118 that extend through the front surface 112 of the showerhead 110. The illustrated embodiment shows the plurality of apertures 118 in fluid communication with the plenum 116 so that a gas flowing through the inlet 105 enters the plenum and diffuses to the outer portion of the plenum and through the apertures 118 into a process gap 125 between the front surface 112 of the showerhead 110 and a support surface 122 of the substrate support 120.

In the illustrated embodiment, each of the apertures 118 has a back opening 117 in at a junction of the front wall 113 and the plenum 116 and a front opening 119 at the front surface 112.

The substrate support includes a support surface 122 configured to support a wafer 102 during processing. During use, the support surface 122 is spaced a process gap 125 having a gap distance D from the front surface 112 of the showerhead 110 so that the flow of fluid from the showerhead 110 forms a boundary layer 130 adjacent a wafer 102 on the support surface 122. In one or more embodiments, the processing chamber 100 is configured to disrupt the boundary layer 130 while a fluid is flowing through the showerhead.

In some embodiments, the processing chamber 100 configured to disrupt the thickness $T_B$ of the boundary layer 130 by changing the gap distance D of the process gap 125. In some embodiments, changing the thickness $T_B$ of the boundary layer 130 comprises changing the gap distance D of the process gap 125 by moving the substrate support 120 closer to and further from the front surface 112 of the showerhead 110. In some embodiments, changing the process gap comprises moving the front surface of the showerhead closer to and further from the substrate support.

Figures 2A, 2B, 2C:
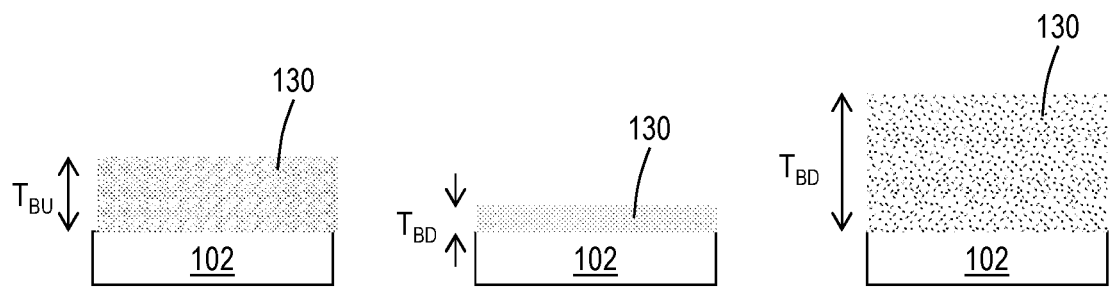
FIGS. 2A through 2C show a schematic representation of the boundary layer in accordance with one or more embodiment of the disclosure.

FIG. 2A illustrates a boundary layer 130 with an undisrupted thickness $T_{BU}$ over a wafer 102. FIG. 2B shows a boundary layer 130 with a disrupted thickness $T_{BD}$ that is smaller than the undisrupted thickness $T_{BU}$. FIG. 2C shows a boundary layer 130 with a disrupted thickness $T_{BD}$ that is greater than the undisrupted thickness $T_{BU}$. The thickness $T_B$ of the boundary layer 130 can be affected by one or more embodiment of the disclosure as described below.

Another aspect of the disclosure provides a showerhead within the processing chamber. The showerhead comprises a front surface and a back surface that define a thickness of the showerhead. The showerhead may have a plurality of apertures to allow a fluid to flow through the showerhead from an inlet connected to the back surface of the showerhead. The inlet may have an opening in the back surface of the showerhead. The plurality of apertures may extend through the thickness of the showerhead. Each of the apertures may have a back opening in the back surface and a front opening in the front surface. In some embodiments, the inlet may be configured to disrupt the boundary layer by changing one or more of the pressure, flow rate, time and temperature of the fluid when the fluid enters in the showerhead.

Another aspect of the disclosure provides a substrate support with a processing chamber. The substrate support may comprise a support surface configured to support a substrate during processing. The support surface may be spaced a process gap from a showerhead so that a flow of fluid from the showerhead forms a boundary layer adjacent the support surface. In some embodiments, the substrate support may be configured to disrupt the boundary layer. In some embodiments, the substrate support may be configured to disrupt the boundary layer by changing the process gap. In some embodiments, the substrate support may be configured to disrupt the boundary layer by a vibratory movement. In some embodiments, the vibratory movement may be one or more of a horizontal, a vertical or random movement.

Figure 3:
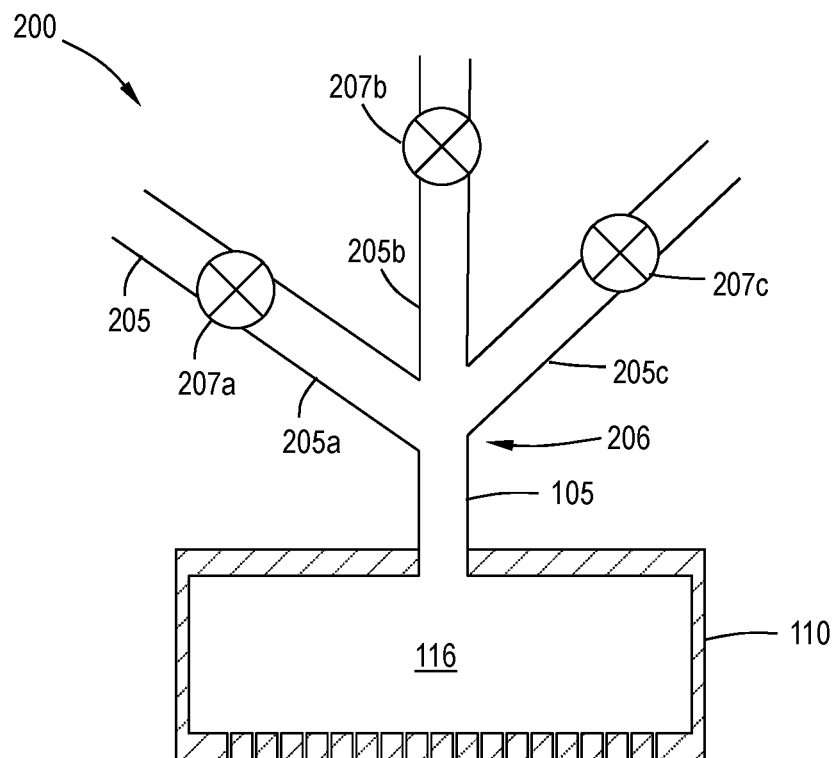
FIG. 3 shows a cross-sectional schematic view of a gas inlet in accordance with one or more embodiment of the disclosure.

Accordingly, one or more embodiments of the disclosure are directed to process chamber configured for disturbing the boundary layer. FIG. 1 illustrates a cross-sectional view of a processing chamber in accordance with one or more embodiment of the disclosure. FIG. 2 illustrates a cross-sectional view of a process chamber inlet, vacuum outlet and purge inlet in accordance with one or more embodiment of the disclosure. FIG. 3 illustrates a cross-sectional view of an inlet in accordance with one or more embodiment of the disclosure. FIG. 4 illustrates a schematic representation of a processing platform in accordance with one or more embodiment of the disclosure.

With reference to FIG. 1, the processing chamber 100 that is configured to disrupt the boundary layer while a fluid is flowing through the showerhead 110. The processing chamber 100 comprises a showerhead 110 and a substrate support 120 as described herein. In some embodiments, the showerhead 110 comprises a front wall 113 with a front surface 112 and a back surface 114. In some embodiments, the showerhead 110 has a plurality of apertures 118 to allow a fluid to flow through the showerhead 110. The plurality of apertures 118 extends through the thickness of the front wall 113 of the showerhead 110. In some embodiments each of the apertures 118 has a back opening 117 in the back surface 114 of the front wall 113 and a front opening 119 in the front surface 112 of the front wall.

One or more embodiments of the present disclosure provide a substrate support 120 configured to support a wafer 102. The substrate support 120 is spaced from the front surface 112 of the showerhead 110 to have a process gap 125 so that a flow of fluid from the showerhead 110 forms a boundary layer 130 adjacent the support surface 122 over the wafer 102. In some embodiments, the wafer 102 is a wafer. In some embodiments, the processing chamber 100 also comprises a vacuum outlet 160, as discussed below with respect to FIG. 5. In some embodiments, the processing chamber 100 comprises a purge inlet 170, as discussed below with respect to FIG. 5.

In one or more embodiment of the disclosure, the undisrupted boundary layer 130 is disrupted by use of one or more mechanical actuators 140. In some embodiments, the mechanical actuators 140 change one or more of pressure, flow rate, pulse time or concentration at the substrate interface. Suitable examples of actuators 140 include but are not limited to, pulsing flow control valves, pressure control valves, motors that control the motions of the substrate support 120 (including translational, rotational and/or vibrational components). In some embodiments, the motors are configured to move the substrate support to provide one or more of vertical, horizontal, rotary and/or vibratory motion.

In some embodiments, the actuator 140 is configured to move the substrate support 120 closer to and/or further from the front surface 112 of the showerhead 110. For example, the actuator 140 of some embodiments is connected to and configured to move the substrate support along a Z-axis direction, also referred to as a vertical direction. In some embodiments, the actuator 140 is connected to and configured to move the showerhead 110 closer to and/or further from the front surface 112 of the substrate support 120.

In some embodiments, the actuator 140 is configured to move the substrate support 120 around a central axis 101. In some embodiments, the actuator 140 is connected to and configured to rotate the substrate support 120 around the central axis 101. In some embodiments, the substrate support 120 is located at a distance from the central axis so that a center axis of the support surface is offset from the central axis 101. In embodiments of this sort, the actuator 140 is configured to rotate the substrate support around the central axis 101 between a first angle and a second angle to oscillate the support surface between the first angle and the second angle. The oscillations of some embodiments are symmetrical around a center point defined as the mid-point between the first angle and second angle. In some embodiments, the oscillations are asymmetrical with respect to a center point.

In some embodiments, the actuator 140 causes vibration of the support surface 122 of the substrate support 120. For example, the actuator 140 of some embodiments is a vibration-inducing component. Suitable vibration-inducing components include, but are not limited to, off-balance motors and piezoelectric crystals (like a sonicator transducer).

One or more embodiment of the disclosure disrupts the boundary layer by changing gas flow characteristics in the process gap 125. In some embodiments, as shown in FIG. 3, the gas delivery system 200 is in fluid communication with the showerhead 110 through inlet 105. In some embodiments, there is more than one inlet 105. The inlet 105 is also referred to as a first opening in the back surface of the showerhead 110. One or more gas inlet line openings are connected to the inlet 105 through conduits 205. The conduits 205 are connected to a gas source (not shown) so that a gas can flow through conduit 205, through inlet 105 into plenum 116 of the showerhead 110. The gas sources can be any gas known to the skilled artisan including, but not limited to, reactive gases, purge gases, carrier gases and a catalysts.

In the embodiment illustrated in FIG. 3, the gas delivery system 200 includes a first conduit 205a in fluid communication with a first gas source (not shown), a second conduit 205b in fluid communication with a second gas source (not shown) and a third conduit 205c in fluid communication with a third gas source (not shown). In the exemplary embodiment illustrated in FIG. 3, the first conduit 205a is in fluid communication with a reactant (not shown), the second conduit 205b is in fluid communication with a purge or carrier gas (not shown) and the third conduit 205c is in fluid communication with a second reactant or catalyst (not shown). The first conduit 205a has a first control valve 207a configured to control a flow of fluid through the first conduit 205a, the second conduit 205b has a second control valve 207b configured to control a flow of fluid through the second conduit 205b, and the third conduit 205c has a third control valve 207c configured to control a flow of fluid through the third conduit 205c. In some embodiments, one or more controller is connected to and configured to control the first control valve 207a, second control valve 207b and/or third control valve 207c.

In one or more embodiments, the first conduit comprises a reactant inlet controller system. In one or more embodiments, the reactant inlet controller system comprises a diaphragm pump. In some embodiments, the reactant inlet controller system is programmable. In one or more embodiments, the reactant inlet controller system is programmed to provide a flow of reactant continuously. In one or more embodiments, the reactant inlet controller system is programmed to provide a flow of reactant in pulses. In some embodiments, the reactant inlet controller system is programmed to change the pressure of reactant flowing through the reactant inlet (first conduit 205a). In some embodiments, the reactant inlet controller system is programmed to change the time of reactant flowing through the reactant inlet (first conduit 205a).

In one or more embodiments, the second conduit comprises a carrier inlet controller system. The skilled artisan will recognize that the terms "carrier gas", "purge gas" and the like are used interchangeably to refer to a non-reactive gas. In some embodiments, one or more inert gas flows through the carrier inlet (second conduit 205b). In one or more embodiments, the carrier inlet comprises a diaphragm pump. In some embodiments, the carrier inlet controller system is programmable. In one or more embodiments, the carrier inlet controller system is configured to allow the carrier or purge gas to flow continuously. In one or more embodiments, the carrier inlet controller system is configured to allow a plurality of carrier pulses to flow into the showerhead 110. In some embodiments, the carrier inlet controller system is configured to change the pressure of carrier gas flowing through the carrier inlet (second conduit 205b).

In some embodiments, a catalyst or make-up inert gas flows through the catalyst inlet (third conduit 205c). The skilled artisan will recognize that the third conduit 205c, while being referred to as a catalyst inlet, can provide a flow of a catalyst or a make-up gas to replace gas flowing through the first conduit 205a when the first control valve 207a is closed. In some embodiments, the catalyst is flowed in an inert carrier gas. In some embodiments, the carrier inlet controller system is programmed to change the pulse length or timing flowing through the third conduit 205c. In one or more embodiments, the catalyst inlet comprises a catalyst inlet controller system. In one or more embodiments, the catalyst inlet controller system comprises a diaphragm pump. In some embodiments, the catalyst inlet controller system is programmable. In one or more embodiments, the catalyst inlet controller system is configured to allow the catalyst to flow through the third conduit 205c continuously. In one or more embodiments, the catalyst inlet controller system is configured to allow a plurality of catalyst pulses to flow through the third conduit 205c. In some embodiments, the catalyst inlet controller system is configured to change the pressure of catalyst flowing through the third conduit 205c. In some embodiments, the catalyst inlet controller system is configured to change the timing (onset and/or duration) of catalyst flowing through the third conduit 205c.

One or more embodiments of the disclosure provide the flow of fluid comprising one or more of a reactant and an inert gas. In some embodiments, the reactant comprises a precursor and a catalyst. In some embodiments, the flow of fluid comprising the reactant and the inert gas in a ratio. In some embodiments, the ratio of the reactant and the inert gas may be in the range of 1:1000 to 1000:1, 1:900 to 900:1, 1:800: to 800:1, 1:700 to 700:1, 1:600 to 600:1, 1:500 to 500:1, 1:400 to 400:1, 1:200 to 200:1, 1:100 to 100:1, 1:50 to 50:1, 1:20 to 20:1, 1:10 to 10:1 or 1:5 to 5:1. In some embodiments, the ratio of the reactant and the inert gas may be 1:1000, 1:100, 1:50, 1:25, 3:50, 2:25, 1:10, 1:5, 3:10, 2:5, 1:2, 3:5, 7:10, 4:5, 9:10, 1:1, 10:9, 5:4, 10:7, 5:3, 2:1, 5:2, 10:3, 5:1, 10:1, 25:2, 50:3, 25:1, 50:1, 100:1 or 1000:1.

One or more embodiments of the disclosure provide the processing chamber is configured to change concentration of reactants to disrupt the boundary layer. In some embodiments, the change in concentration of reactants. In some embodiments, the change in concentration of reactants is achieved in the boundary layer.

One or more embodiments of the disclosure provide processing chambers comprising an inlet in fluid communication with the showerhead to provide a fluid flow to the back surface of the showerhead, the inlet having a diaphragm pump configured to change the pressure of the fluid. In some embodiments, the fluid comprises one or more of a reactant, an inert gas and a catalyst. In some embodiments, the inlet comprises an inlet controller system. In some embodiments, the inlet controller system is programmable. In some embodiments, the inlet controller system is configured to disrupt the boundary layer by changing one or more of the pressure, flow rate, time or temperature of the fluid flowing through the inlet when the fluid enters in the showerhead. In some embodiments, the inlet controller system is configured to provide a steady supply of the fluid to the showerhead. In some embodiments, the inlet controller system is configured to provide pulses of the fluid to the showerhead.

Figures 4A, 4B:
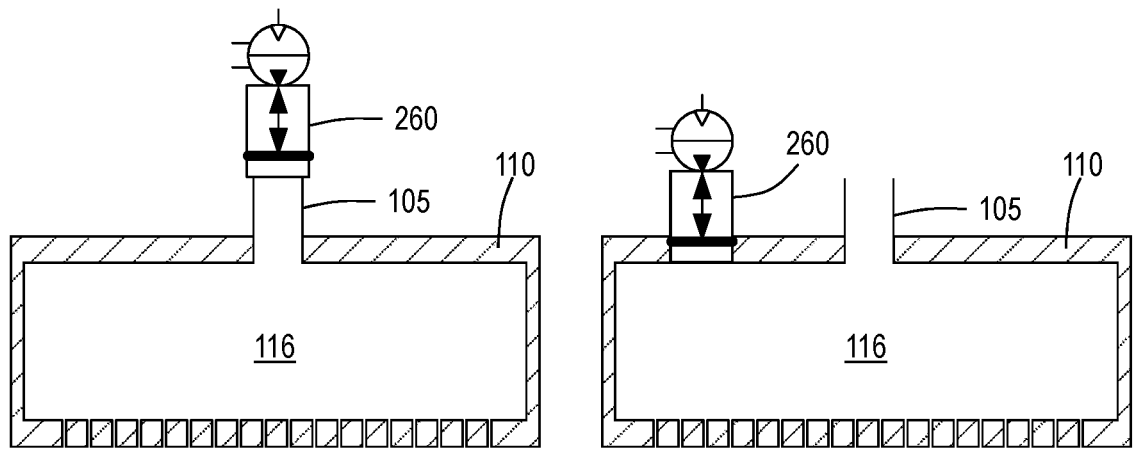
FIGS. 4A and 4B show cross-sectional schematic views of a showerhead and gas inlet with diaphragm according to one or more embodiment of the disclosure.

FIG. 4A shows an embodiment in which the diaphragm 260 is in-line with the inlet 105 so that at least one of the process gases flows through the diaphragm 260. During processing, the diaphragm 260 of some embodiments is actuated to change the volume of the plenum 116, causing changes in the pressure of the process gas, disrupting the boundary layer. In some embodiments, there is more than one process gas flowing into the plenum 116 through the diaphragm 260. In some embodiments, one process gas flows through the diaphragm 260. In some embodiments, the one process gas flowing through the diaphragm 260 is an inert or carrier gas. A person skilled in the art would recognize that the diaphragm 260 does not have to be in-line with the inlet 105. FIG. 4B shows an embodiment in which the diaphragm 260 is fluid communication with the plenum 116 that is not in-line with the inlet 105. During processing, the diaphragm 260 of some embodiments is actuated to change the volume of the plenum 116, causing changes in the pressure of the process gas, disrupting the boundary layer. In some embodiments, there is more than one process gas flowing into the plenum 116 through the diaphragm 260. In some embodiments, one process gas flows through the diaphragm 260. In some embodiments, the one process gas flowing through the diaphragm 260 is an inert or carrier gas.

Figure 5:
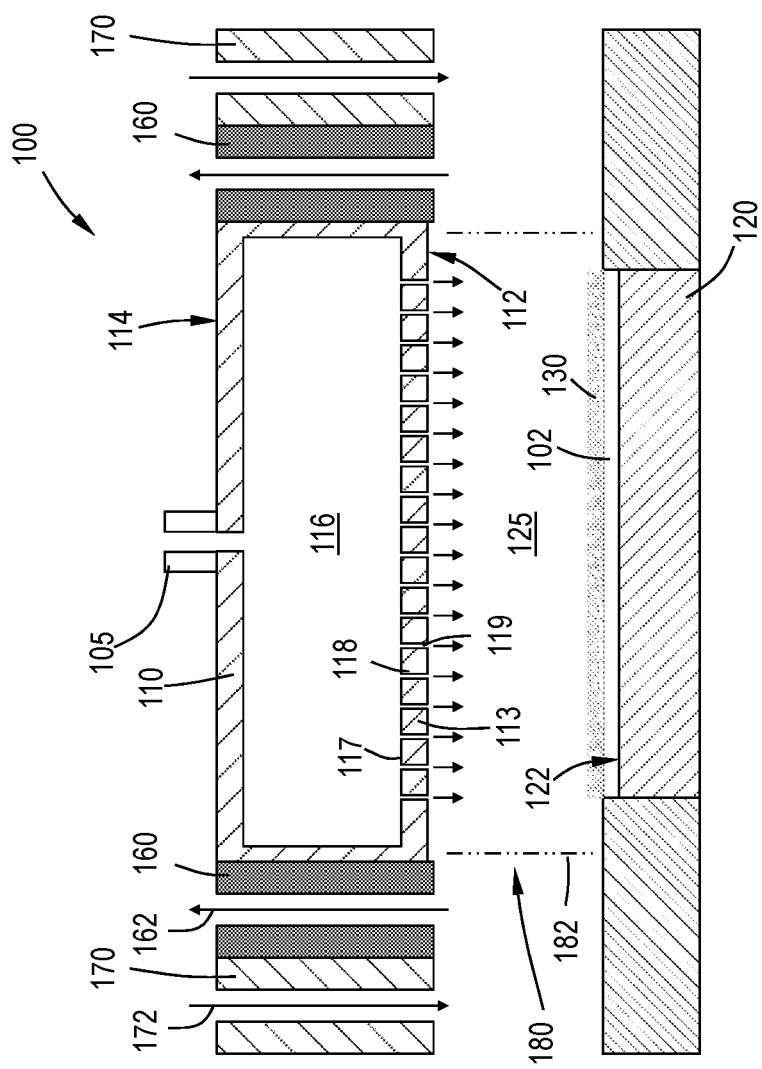
FIG. 5 shows a cross-sectional schematic view of a processing chamber in accordance with one or more embodiment of the disclosure.
Figure 5:
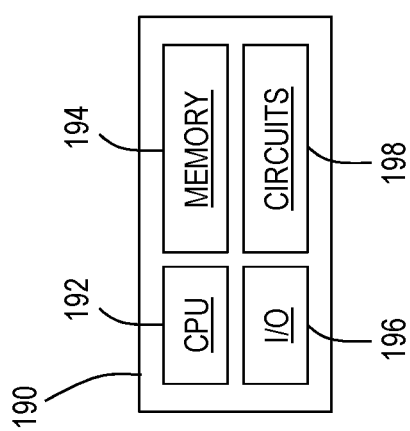

Referring to FIG. 5, one or more embodiments of the disclosure provide a processing chamber comprising one or more of a vacuum outlet 160 and a purge gas inlet 170 defining an outer periphery 180 of the process gap 125. The outer periphery 180 of the process gap 125 is illustrated using a dash-dot-dot line 182. The outer periphery 180 of the process gap 125 is the region outside the diameter of the wafer 102 where the gas flowing from the plenum 116 across the surface of the wafer 102 is evacuated through vacuum outlet 160. The combination of a vacuum stream 162 through the vacuum outlet 160 and purge gas stream 172 through the purge gas inlet form a "gas curtain". The gas curtain prevents process gases from within the process gap 125 from migrating from the process gap 125 into the other areas of the process chamber.

One or more embodiments of the disclosure disrupt the boundary layer 130 by changing one or more of the flow rate or pressure of the fluid flowing through the showerhead 110 into the process gap 125 and/or a fluid flow out of the process gap. In some embodiments, the fluid flow out of the process gap 125 may be changed by changing the vacuum pressure provided at the vacuum outlet 160. Stated differently, in some embodiments, the boundary layer 130 is disrupted by changing the vacuum pressure to change a characteristic (e.g., flow rate) of the vacuum stream 162.

In some embodiments, the boundary layer 130 is disrupted by changing the pressure of the purge gas or flow rate of the purge gas stream 172 at the outer periphery of the process gap 125. In some embodiments, the boundary layer 130 is disrupted by changing one or more of the flow rate of purge gas in the purge gas stream 172 or the flow rate of fluid in the vacuum stream 162.

One or more embodiments of the disclosure provide the processing chamber comprising a controller of the processing chamber, wherein the controller is capable of executing instructions from a non-transitory computer readable medium, that, when executed by the controller, causes the processing chamber to disrupt the boundary layer.

One or more embodiments of the disclosure provide the boundary layer has an undisrupted thickness and a disrupted thickness. One or more embodiments of the disclosure provide the undisrupted thickness in the range of 0.01 mm to 2 mm, 0.05 mm to 2 mm, 0.1 mm to 2 mm, 0.15 mm to 2 mm, 0.2 mm to 2 mm, 0.25 mm to 2 mm, 0.3 mm to 2 mm, 0.35 mm to 2 mm, 0.4 mm to 2 mm, 0.45 mm to 2 mm, 0.5 mm to 2 mm, 0.01 mm to 1 mm, 0.05 mm to 1 mm, 0.1 mm to 1 mm, 0.15 mm to 1 mm, 0.2 mm to 1 mm, 0.25 mm to 1 mm, 0.3 mm to 1 mm, 0.35 mm to 1 mm, 0.4 mm to 1 mm, 0.45 mm to 1 mm and 0.5 mm to 1 mm.

One or more embodiments of the disclosure provide the disrupted thickness is in the range of 0.01 mm to 10 mm, 0.05 mm to 10 mm, 0.1 mm to 10 mm, 0.15 mm to 10 mm, 0.2 mm to 10 mm, 0.25 mm to 10 mm, 0.3 mm to 10 mm, 0.35 mm to 10 mm, 0.4 mm to 10 mm, 0.45 mm to 10 mm, 0.5 mm to 10 mm, 0.01 mm to 5 mm, 0.05 mm to 5 mm, 0.1 mm to 5 mm, 0.15 mm to 5 mm, 0.2 mm to 5 mm, 0.25 mm to 5 mm, 0.3 mm to 5 mm, 0.35 mm to 5 mm, 0.4 mm to 5 mm, 0.45 mm to 5 mm, 0.5 mm to 5 mm, 0.01 mm to 2 mm, 0.05 mm to 2 mm, 0.1 mm to 2 mm, 0.15 mm to 2 mm, 0.2 mm to 2 mm, 0.25 mm to 2 mm, 0.3 mm to 2 mm, 0.35 mm to 2 mm, 0.4 mm to 2 mm, 0.45 mm to 2 mm, 0.5 mm to 2 mm, 0.01 mm to 1 mm, 0.05 mm to 1 mm, 0.1 mm to 1 mm, 0.15 mm to 1 mm, 0.2 mm to 1 mm, 0.25 mm to 1 mm, 0.3 mm to 1 mm, 0.35 mm to 1 mm, 0.4 mm to 1 mm, 0.45 mm to 1 mm and 0.5 mm to 1 mm.

One or more embodiment of the disclosure provide the processing chamber is configured to disrupt the thickness of undisrupted boundary layer in the range of 1% to 50%, 1% to 45%, 1% to 40%, 1% to 35%, 1% to 30%, 1% to 25%, 1% to 20%, 1% to 15%, 1% to 10%, 1% to 5%, 5% to 50%, 5% to 45%, 5% to 40%, 5% to 35%, 5% to 30%, 5% to 25%, 5% to 20%, 5% to 15%, 5% to 10%, 10% to 50%, 10% to 45%, 10% to 40%, 10% to 35%, 10% to 30%, 10% to 25%, 10% to 20%, 10% to 15%, 20% to 50%, 20% to 45%, 20% to 40%, 20% to 35%, 20% to 30%, 20% to 25%, 30% to 50%, 30% to 45%, 30% to 40%, 30% to 35%, 40% to 50% or 40% to 45%.

One or more embodiment of the disclosure provide the disrupted thickness of boundary layer is different relative to the undisrupted thickness is the amount greater than or equal to 50%, greater than or equal to 40%, greater than or equal to 30%, greater than or equal to 20%, greater than or equal to 10%, greater than or equal to 5% greater than or equal to 2% or greater than or equal to 1%.

Referring again to FIG. 5, some embodiments include a controller 190 coupled to various components of the processing chamber 100 to control the operation thereof. The controller 190 of some embodiments controls the entire processing chamber (not shown). In some embodiments, the processing chamber 100 includes multiple controllers, of which controller 190 is a part; each controller is configured to control one or more individual portions of the processing chamber. For example, the processing chamber of some embodiments comprises separate controllers for one or more of the process gas flow into the showerhead, purge gas flow, vacuum pressure, process gap size, temperature control, and/or actuators.

The controller 190 may be one of any form of general-purpose computer processor, microcontroller, microprocessor, etc., that can be used in an industrial setting for controlling various chambers and sub-processors. The at least one controller 190 of some embodiments has a processor 192, a memory 194 coupled to the processor 192, input/output devices 196 coupled to the processor 192, and support circuits 198 to communication between the different electronic and physical components. The memory 194 of some embodiments includes one or more of transitory memory (e.g., random access memory) and non-transitory memory (e.g., storage).

The memory 194, or a computer-readable medium, of the processor may be one or more of readily available memory such as random access memory (RAM), read-only memory (ROM), floppy disk, hard disk, or any other form of digital storage, local or remote. The memory 194 can retain an instruction set that is operable by the processor 192 to control parameters and components of the system. The support circuits 198 are coupled to the processor 192 for supporting the processor in a conventional manner. Circuits may include, for example, cache, power supplies, clock circuits, input/output circuitry, subsystems, and the like. Circuits also include motors, actuators, gauges (e.g., thermocouple, pyrometer, manometers), valves, etc., that are used to operate the process chamber and control the components that support the methods.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A processing chamber comprising:
   a showerhead within the processing chamber, the showerhead having a front surface and a back surface that define a thickness of the showerhead, the showerhead having a plurality of apertures to allow a fluid to flow through the showerhead, the plurality of apertures extending through the thickness of the showerhead;
   a substrate support having a support surface configured to support a wafer during processing, the support surface spaced a process gap from the front surface of the showerhead so that a flow of fluid from the showerhead forms a boundary layer having a thickness adjacent the support surface; and
   one or more actuators controlling a motion of the substrate support,
   wherein the one or more actuators is/are configured to jitter the substrate support parallel to the showerhead while a fluid is flowing through the showerhead, and thereby disrupt the thickness of the boundary layer.

2. The processing chamber of claim 1, wherein the boundary layer has an undisrupted thickness and a disrupted thickness.

3. The processing chamber of claim 2, wherein the thickness of the boundary layer is further disrupted by changing the process gap.

4. The processing chamber of claim 3, wherein changing the process gap comprises moving the substrate support closer to and further from the front surface of the showerhead.

5. The processing chamber of claim 2, wherein the thickness of the boundary layer is disrupted by changing one or more of a flow rate or pressure of the fluid flowing through the showerhead.

6. The processing chamber of claim 5, wherein one or more of the flow rate or pressure of the fluid flowing through the showerhead is changed by changing one or more of a fluid flow into the process gap through the showerhead or a fluid flow out of the process gap.

7. The processing chamber of claim 6, further comprising a diaphragm pump in fluid communication with the showerhead, the diaphragm pump is configured to change the pressure of the fluid.

8. The processing chamber of claim 2, further comprising one or more of a vacuum outlet and a purge gas inlet defining an outer periphery of the process gap.

9. The processing chamber of claim 8, wherein the thickness of the boundary layer is disrupted by changing a vacuum pressure of the vacuum outlet.

10. The processing chamber of claim 8, wherein the thickness of the boundary layer is disrupted by changing a pressure of the purge gas inlet.

11. The processing chamber of claim 2, wherein the undisrupted thickness of the boundary layer is in the range of 0.1 to 2 mm.

12. The processing chamber of claim 11, wherein the disrupted thickness of the boundary layer is greater than or equal to 10% difference relative to the undisrupted thickness.

13. The processing chamber of claim 2, wherein an inlet is connected to and in fluid communication with a gas delivery system comprising one or more of a first conduit, a second conduit and a third conduit, wherein the first conduit comprises a first control valve to control a flow of a first gas through the first conduit, the second conduit comprises a second control valve to control the flow of a second gas through the second conduit, and the third conduit comprises a third control valve to control the flow of a third gas through the third conduit.

14. The processing chamber of claim 13, further comprising one or more controller configured to disrupt the boundary layer by changing one or more of pressure, flow rate, pulse time or temperature of a fluid passing through the first conduit, second conduit or third conduit when entering in the showerhead.

15. A substrate support within a processing chamber, wherein the substrate support comprises a support surface and one or more actuators, the substrate support is configured to support a substrate during processing, the support surface spaced a process gap from a showerhead so that a flow of fluid from the showerhead forms a boundary layer adjacent the support surface, the one or more actuators that controls a motion of the substrate support comprising rotation motor assemblies, off-balance motors or piezoelectric crystals, wherein the one or more actuators is/are configured to jitter or vibrate the substrate support, and thereby disrupt the thickness of the boundary layer.

16. The substrate support of claim 15, wherein the substrate support is configured to disrupt the boundary layer by changing the process gap.

17. The substrate support of claim 15, wherein the vibratory movement is one or more of a horizontal, a vertical or random movement.

18. A processing chamber comprising:
a showerhead within a processing chamber, wherein the showerhead comprises a front surface and a back surface that define a thickness of the showerhead, the showerhead having a plurality of apertures to allow a fluid to flow through the showerhead from an inlet connected to the back surface of the showerhead, the inlet has an opening in the back surface of the showerhead, the plurality of apertures extending through the thickness of the showerhead, each of the apertures having a back opening in the back surface and a front opening in the front surface, the inlet comprising one or more of pulsing flow control valves or pressure control valves; and
a substrate support comprising a support surface and one or more actuators, the support surface spaced a process gap from the front surface of the showerhead so that a flow of fluid from the showerhead forms a boundary layer having a thickness adjacent the support surface, and the one or more or more actuators controls a motion of the substrate support, the one or more actuators comprising rotation motor assemblies, off-balance motors or piezoelectric crystals,
wherein one or more of the pulsing flow control valves, pressure control valves, rotation motor assemblies, off-balance motors or piezoelectric crystals is/are configured to change a flow rate of the fluid flowing through the showerhead, change a pressure of the fluid flowing through the showerhead, jitter the substrate support parallel to the showerhead while a fluid is flowing through the showerhead, and/or vibrate the substrate support parallel to the showerhead while a fluid is flowing through the showerhead, and thereby disrupt the thickness of the boundary layer.

19. The processing chamber of claim 18, wherein the substrate support further disrupts the thickness of the boundary layer by changing the process gap comprising moving the substrate support closer to and further from the front surface of the showerhead.

20. The processing chamber of claim 18, further comprising one or more of a vacuum outlet and a purge gas inlet defining an outer periphery of the process gap, wherein the thickness of the boundary layer is disrupted by one or more of changing a vacuum pressure of the vacuum outlet or changing a pressure of the purge gas inlet.

* * * * *